United States Patent
Lin et al.

(10) Patent No.: US 7,149,088 B2
(45) Date of Patent: Dec. 12, 2006

(54) HALF-BRIDGE POWER MODULE WITH INSERT MOLDED HEATSINKS

(75) Inventors: Heny Lin, Irvine, CA (US); Bertrand Vaysse, Toulouse (FR); Fabio Necco, Manhattan Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 17 days.

(21) Appl. No.: 10/871,246

(22) Filed: Jun. 18, 2004

(65) Prior Publication Data

US 2005/0280998 A1   Dec. 22, 2005

(51) Int. Cl.
*H05K 7/20* (2006.01)

(52) U.S. Cl. .................. 361/704; 361/707; 257/707; 257/712

(58) Field of Classification Search ........... 361/704, 361/707, 715, 717; 174/52.2, 52.4, 16.3; 257/687, 706, 707, 712, 713, 675; 165/80.3, 165/185
See application file for complete search history.

(56) References Cited

U.S. PATENT DOCUMENTS

| | | | | |
|---|---|---|---|---|
| 5,398,160 A | * | 3/1995 | Umeda | 361/707 |
| 5,521,437 A | * | 5/1996 | Oshima et al. | 257/701 |
| 5,625,536 A | * | 4/1997 | Soyano et al. | 361/736 |
| 5,691,884 A | * | 11/1997 | Soyano et al. | 361/707 |
| 5,703,399 A | * | 12/1997 | Majumdar et al. | 257/723 |
| 5,767,573 A | * | 6/1998 | Noda et al. | 257/675 |
| 5,808,359 A | * | 9/1998 | Muto et al. | 257/712 |
| 6,147,869 A | * | 11/2000 | Furnival | 361/719 |
| 6,272,015 B1 | * | 8/2001 | Mangtani | 361/707 |
| 6,310,775 B1 | * | 10/2001 | Nagatomo et al. | 361/707 |
| 6,320,747 B1 | * | 11/2001 | Jahn et al. | 361/704 |
| 6,421,244 B1 | * | 7/2002 | Shinohara et al. | 361/736 |
| 6,509,629 B1 | * | 1/2003 | Yoshimatsu et al. | 257/660 |
| 6,703,703 B1 | * | 3/2004 | Grant | 257/688 |
| 6,885,097 B1 | * | 4/2005 | Maeno et al. | 257/698 |
| 6,979,594 B1 | * | 12/2005 | Fan et al. | 438/113 |
| 6,979,909 B1 | * | 12/2005 | Shinohara | 257/796 |
| 6,995,461 B1 | * | 2/2006 | Soyano et al. | 257/678 |

\* cited by examiner

*Primary Examiner*—Boris Chervinsky
(74) *Attorney, Agent, or Firm*—Ostrolenk, Faber, Gerb & Soffen, LLP

(57) ABSTRACT

A power module which includes heatsinks made of AlSiC and power semiconductor devices directly mounted thereon.

23 Claims, 4 Drawing Sheets

HALF-BRIDGE POWER MODULE WITH INSERT MOLDED HEATSINKS

RELATED APPLICATION

This application is based on and claims benefit of U.S. Provisional Application No. 60/478,996, filed on Jun. 17, 2003, entitled Half-Bridge Power Module With Insert Molded Heat Sinks, to which a claim of priority is hereby made, and the disclosure of which is incorporated by reference.

BACKGROUND OF THE INVENTION

The thermal performance of a power semiconductor device module depends on the material "stack" used for the module application. For example, in a common half-bridge power module (a typical module used in automotive applications), the transistors or semiconductor die are soldered to a substrate, which then can be soldered or fastened to a heat sink or base plate. In both cases, the stack-up of materials will generate high thermal resistance from the semiconductor junction to the heat sink.

The interface between the many layers of the stack-ups has the following drawbacks:

1. When the substrate is fastened to a heat sink, a thermal interface layer will need to be added to eliminate the air gap. This system normally has a high thermal resistance.

2. In case of soldering the substrate to a base plate, the system has a processing issue in that soldering a large substrate area to a base-plate can be difficult and can result in limited reliability of performance.

It is desirable to have a power module that does not exhibit the drawbacks of the prior art modules.

SUMMARY OF THE INVENTION

To overcome the drawbacks of the prior art, a half bridge power module (including an ASIC gate driver) is provided with AlSiC heat sinks integrated into a molded frame.

According to one aspect of the present invention semiconductor die are directly attached to the heatsinks, thereby reducing the reliability of performance problems encountered in the prior art.

A module according to the present invention may further include lead frames molded in the frame. In one embodiment of the present invention, a lead frame is provided for power input, a lead frame is provided for ground connection and a lead frame is provided for output connection. The lead frames are then electrically attached, where appropriated, to the heatsinks by wirebonds.

In an alternative embodiment, direct connections can be made to the heatsinks, thereby eliminating some of the wirebonds and thus reducing the resistance of the module.

Other features and advantages of the present invention will become apparent from the following description of the invention which refers to the accompanying drawings.

DETAILED DESCRIPTION OF THE FIGURES

Figure 1:
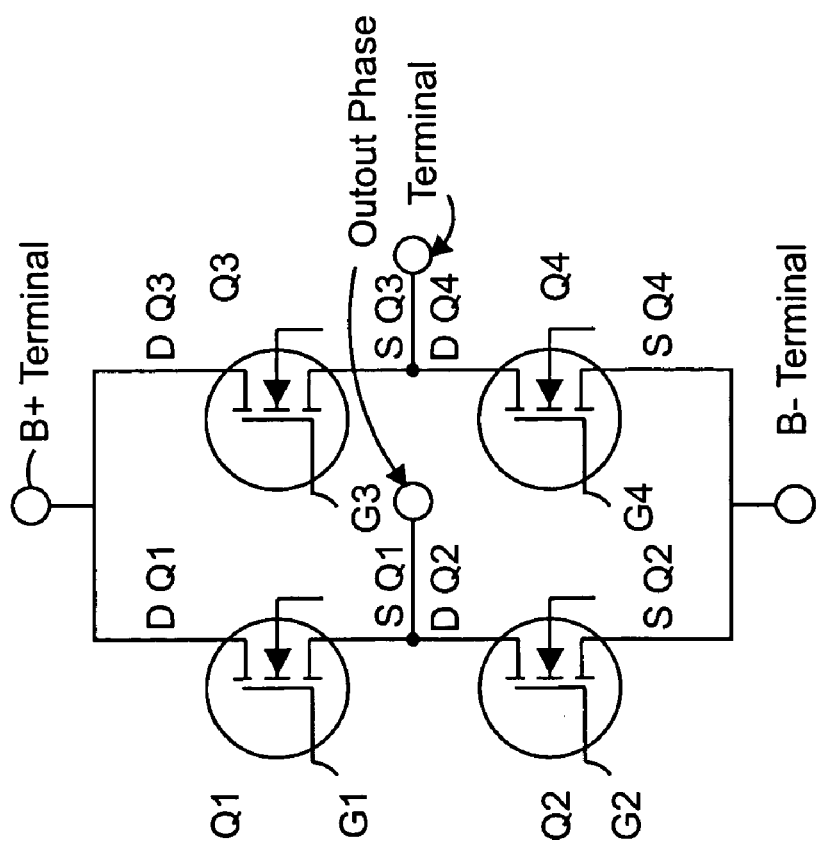
FIG. 1 shows a half-bridge circuit arrangement according to prior art.

Referring to FIG. 1, a conventional half-bridge circuit includes a high side power device Q1 and a low side power device Q2 connected in series between a power bus $B^+$ and ground $B^-$. As is well known, an output signal is usually taken from the connection node of the high side and the low side devices (Q1 and Q2 respectively). As shown in FIG. 1 schematically, for example, an output phase terminal may be provided to selectively feed the output of a half-bridge circuit to a load, which may be, for example, a phase of a motor.

As is well known, and schematically illustrated, any number of half-bridge circuits may be parallel-connected between the power bus $B^+$ and the ground terminal $B^-$. Thus, for example, another half-bridge circuit including another high side power device Q3 and another low side power device Q4 can be connected in series between power bus $B^+$ and ground $B^-$.

A suitable semiconductor power device for use in a half-bridge is an N-channel type power MOSFET. In a half-bridge configuration, an N-channel power MOSFET selected for the high side is electrically connected in series at the source terminal thereof to the drain terminal of the power MOSFET selected for the low side and at the drain side thereof to power bus $B^+$. The source terminal of the power MOSFET selected for the low side is then electrically connected to the ground terminal $B^-$ in order to form a half-bridge circuit. The output signal of the half-bridge so constructed is taken from the point of connection of the source terminal of the power MOSFETs at the high side and the drain terminal of the power MOSFET at the low side.

Figure 2:
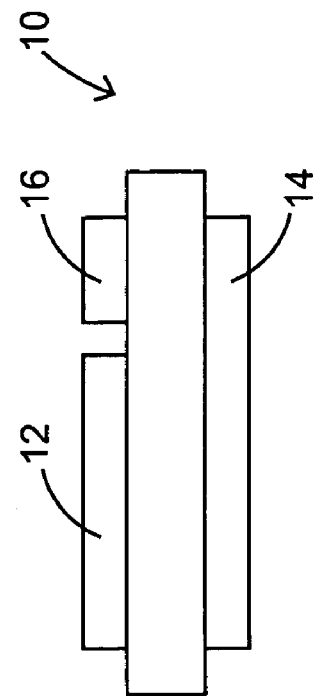
FIG. 2 shows a side view of a power MOSFET according to prior art.

Referring to FIG. 2, a typical power MOSFET 10 conducts electricity vertically through its body between its source electrode 12 which is disposed on a first major surface thereof and its drain electrode 14 on a second opposing major surface thereof. A gate electrode 16 is usually provided on the first major surface lateral to the source electrode 12.

Referring back to FIG. 1, the operation of a power MOSFET can be controlled by providing an appropriate voltage to its gate electrode. Thus, each gate electrode $G_1$, $G_2$, $G_3$, $G_4$ can selectively receive a signal in order to operate. As is well known, a driver chip can be used to control the signals that are sent to the gate electrodes $G_1$, $G_2$, $G_3$, $G_4$ of the MOSFETs in a half-bridge in order to selectively operate the same. A suitable driver chip for the selective control of the signals sent to the gate electrodes $G_1$, $G_2$, $G_3$, $G_4$ of the MOSFETs in a half-bridge circuit may be an ASIC (Application Specific Integrated Circuit) chip. The ASIC chip in turn may be operated by signals received from an external unit, such as a microcontroller as is well known in the art. In a typical half-bridge application an ASIC chip can include a gate driver circuit, as well as over-temperature and over-current protection circuits.

Figure 3A:
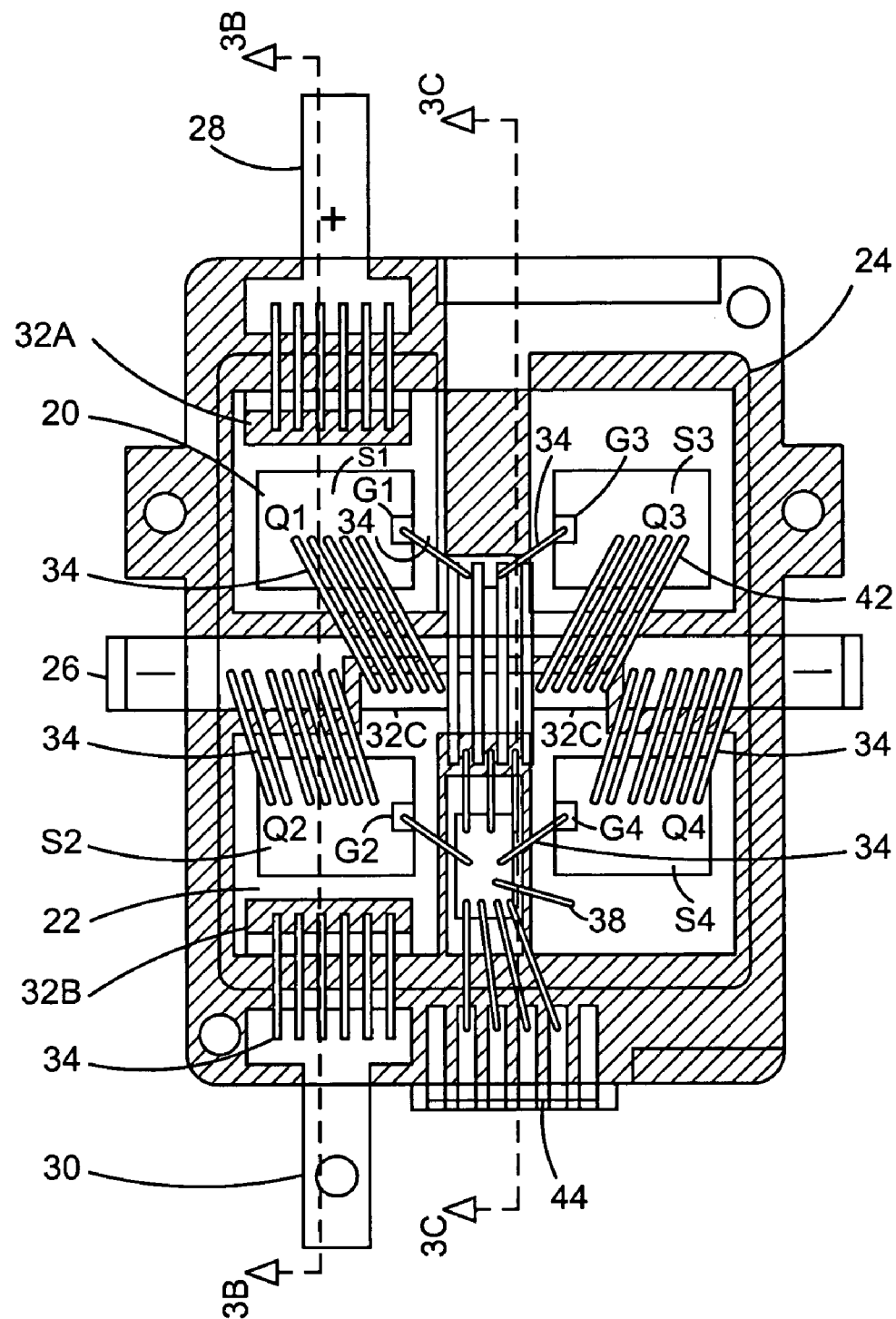
FIG. 3A shows a top plan view of a module according to the present invention.
Figure 3B:
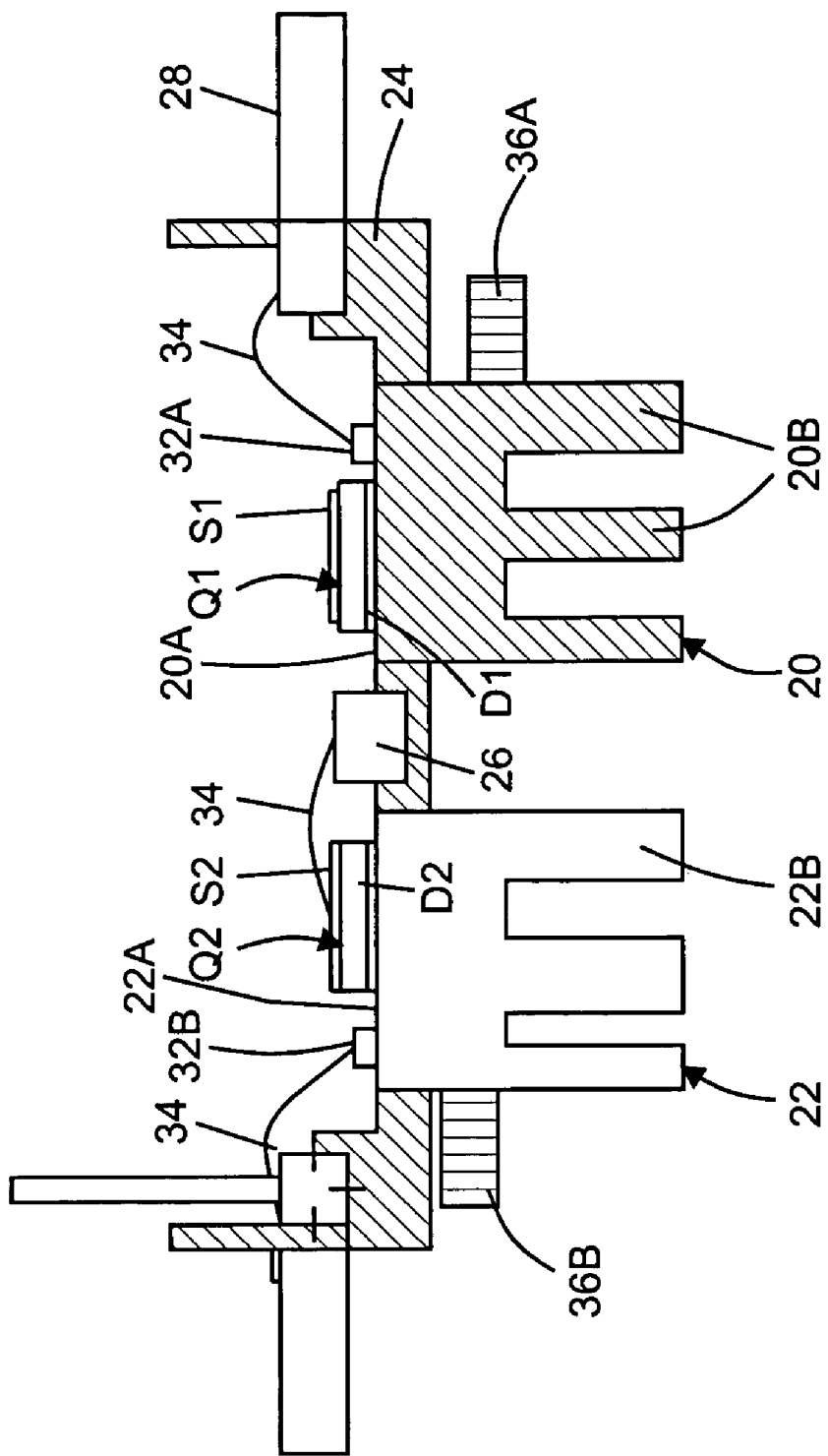
FIG. 3B shows a cross-sectional view of a module according to the present invention along line 3B—3B in FIG. 3A viewed in the direction of the arrows.

Referring now to FIGS. 3A and 3B, a power module according to the present invention includes first heatsink 20, and second heatsink 22. Each heatsink 20, 22 includes a flat top portion 20A, 22A, and preferably a plurality of heat radiating fins 20B, 22B.

According to one aspect of the present invention, heatsinks 20, 22 are insert molded in a molded frame 24.

According to another aspect of the present invention at least one power semiconductor device is disposed on a respective top flat surface 20A, 22A of a heat sink 20, 22. In the preferred embodiment of the present invention, the power semiconductor device is an N-channel MOSFET Q1, Q2. Furthermore, in the preferred embodiment of the present invention at least one more N-channel MOSFET Q3, Q4 is disposed on a respective top flat surface 20A, 22A of a heatsink 20, 22.

According to another aspect of the present invention heatsinks 20, 22 are formed from an electrically conductive material. Each power MOSFET $Q_1$, $Q_2$, $Q_3$, $Q_4$ is electrically connected at its drain side D1,D2 to a respective top flat surface 20A, 22A by, for example, a layer of conductive adhesive such as solder or conductive epoxy.

According to another aspect of the present invention heatsinks 20, 22 are formed from AlSiC (Aluminum Silicon Carbide). AlSiC is comprised of SiC particles in a continuous aluminum metal phase. As is known, the ratio of aluminum and SiC particles can be changed to modify the CTE (coefficient of thermal expansion) of the heatsink in order to meet the specification requirements. The use of AlSiC for heatsinks 20, 22 is advantageous in that it can be designed to have the same coefficient of thermal expansion as the die, thereby reducing thermal stress problems.

A module according to the present invention further includes a ground connection lead frame 26, a power input lead frame 28 and an output connection lead frame 30. Ground connection lead frame 26, power input lead frame 28, and output lead frame 30 are preferably made from copper, although other electrically conductive materials may be suitable for forming these elements. As seen in FIG. 3A, in the preferred embodiment of the present invention, ground lead frame 26 is a single elongated piece which is insert molded in frame 24 at a position between heatsinks 20, 22, while power input lead frame 28 and output lead frame 30 are insert molded in frame 24 at a position opposite ground lead frame 26 at a side of a respective heatsink 20, 22.

According to an aspect of the present invention, each top flat surface 20A, 22A is provided with a wirebondable surface 32A, 32B. The wirebondable surface 32A, 32B may be a solderable anvil having a top aluminum surface for receiving the wirebonds. Thus, as shown in FIG. 3A, a plurality of wirebonds 34 are used to connect power input lead frame 28 to wirebondable surface 32A on heatsink 20, and a plurality of wirebonds 32 are used to connect output lead frame 30 to wirebondable surface 32B on heatsink 22. Furthermore, a plurality of wirebonds 34 are used to connect the source electrodes S2, S4 of MOSFETs Q2, Q4 to ground lead frame 26, and a plurality of wirebonds 34 are used to connect the source electrodes S1, S3 of MOSFETs Q1, Q3 to wirebondable surface 32C on heatsink 22. As a result of the wirebond connections, a half-bridge circuit such as the one shown in FIG. 1 is obtained.

According to a second embodiment of the present invention, at least one or both heatsinks 20, 22 may be provided with an external connector 36A, 36B. An external connector 36A, 36B may be used in lieu of a lead frame. Thus, external connector 36A may serve as the external connection to the power input B⁺ instead of power input lead frame 28, and external connector 36B may serve as the external output connection for the bridge circuits instead of output lead frame 30. External connectors 36A, 36B can be preferably threadably attached to heatsinks 20, 22.

Figure 3C:
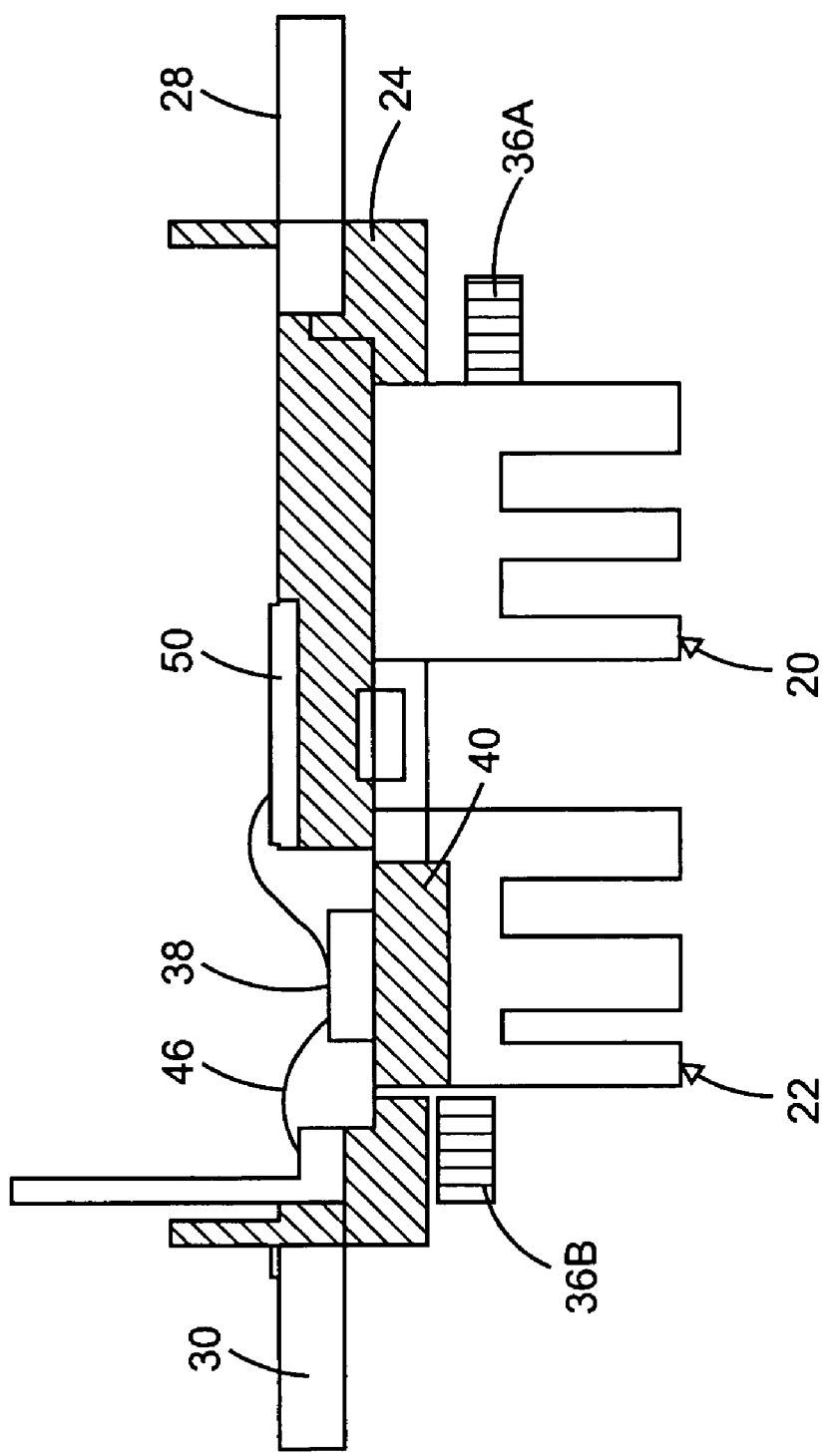
FIG. 3C shows a cross-sectional view of a module according to the present invention along line 3C—3C in FIG. 3A viewed in the direction of the arrows.

Referring now to FIG. 3C, according to an aspect of the present invention, an ASIC chip 38 for driving all MOSFETs $Q_1$, $Q_2$, $Q_3$, $Q_4$ is disposed on an AlSiC plate 40 which is insert molded in frame 24 along with heatsinks 20, 22. Alternatively, ASIC chip 28 may soldered onto any one of the lead frames, depending on its back potential if heat dissipation from ASIC chip 28 is not a concern.

ASIC chip 28 is operatively connected with gate electrodes $G_1$, $G_2$, $G_3$, $G_4$ of MOSFETs $Q_1$, $Q_2$, $Q_3$, $Q_4$ by wirebonds 42. A suitable wirebond 42 may be the same material as wirebonds 34. Specifically, for example, aluminum wirebonds of 0.005 to 0.008 gauge can be used for wirebonds 34 and wirebonds 42.

It should be noted that in the preferred embodiment, conductive jumpers 50 may be used to connect ASIC chip 38 to gate electrodes $G_1$, $G_3$, of MOSFETs Q1, Q3. The use of jumpers 50 is advantageous in that it reduces the required length of a wirebond that may otherwise need to extend from the location of ASIC chip 38 to gate electrodes $G_1$, $G_2$. ASIC chip 38 is electrically connected to external signal connectors 44 by wirebonds 46. External signal connectors 44 are adapted to receive control signals from an external source such as a microcontroller (not shown) outside of the module.

According to an aspect of the present invention, heatsinks 20, 22, power input lead frame 28, ground lead frame 26, output lead frame 30, and plate 40 are insert molded in frame 24. Next, conductive adhesive such as solder is deposited on top flat surface 20A, 22A of heatsinks 20, 22 and MOSFETs $Q_1$, $Q_2$, $Q_3$, $Q_4$ are positioned over the deposits of solder. In order to ensure good connection, a solderable region is formed over the heatsinks 20, 22 on which solder is deposited. The solderable layer may be plated atop flat surfaces 20A, and 22A, and may cover all of the same. Any material capable of receiving solder may be suitable for forming the solderable layer. Thereafter, heat is applied to reflow the solder. Next, the appropriate wirebondings are carried out in order to obtain a module according to the preferred embodiment as described in detail herebefore.

Thus, after molding heatsinks 20,22 with frame 24 the following steps can be carried out to obtain a functional module according to the present invention:

1) Dispense solder paste on the solderable surfaces of heat sinks 20, 22;
2) Attach the die and the ASIC chip;
3) Reflow the solder paste;
4) Deflux to remove the solder paste flux;
5) Perform Aluminum wire bonding;
6) Encapsulate the cavities of the power module (the space above top flat surfaces 20A, 22A) with a potting compound;
7) Attach a lid to cover the cavities with an adhesive, if required by the particular application;
8) Electrical test the module.

According to an aspect of the present invention, the material selected for frame 24 can withstand at least the solder reflow temperature. Thus, frame 24 can keep its structural integrity during the manufacturing process. A suitable material for this purpose may be a glass filled Amodel polymer.

In an exemplary application three modules according to the preferred embodiment of the present invention can be interconnected to make a three-phase bridge configuration. The three-module-three-phase bridge can be mounted on the back of a motor (such as an alternator for an active rectifier application or a starter/alternator application), in a box, on racks, or on metal frames using fasteners and mounting holes. The mounting holes could be a part of frame 26 or heat sinks 20, 22. Since in a module according to the present invention the die are directly mounted to a heat sink, the mounting of the module does not impact thermal performance as do conventional power modules using substrates. The three modules can be placed close to one another and the gate signals of all three devices can be interconnected using a PCB (printed circuit board), a flexible PCB, an insert molded lead frame or a molded flexible PCB. The power input B+ and the ground B− of the modules can be interconnected using, for example, a welding technology.

The advantages of a module according to the present invention are as follows:

Low thermal resistance from the junction of the semiconductor die to the heat sink because of direct soldering of die to heat sink. An estimated 80% reduction in thermal resistance from the junction of MOSFET die to the heat sink can be obtained.

Excellent reliability of performance (power cycling, temperature cycling) since the Coefficient of Thermal Expansion of the die is very close to the Thermal Coefficient of Expansion of the AlSiC heat sink. This concept can also accommodate a large die size without jeopardizing reliability.

The integrated molded lead frame with AlSiC heat sink can be designed and shaped to any unique configuration for a compact design. For example, for the mounting to the back of the motor in a starter alternator design, the module can have a round shape and the lead frame can be routed into many configurations.

Since all the pieces will be integrated into one plastic housing the module can be compact. Furthermore, integrating an ASIC chip (gate driver circuitry) into frame 26 offers short wirebond connections, which reduces space, decreases the number of interconnects and hardware, and improves reliability of performance.

Fewer processing assembly steps are needed since the semiconductor die and the ASIC are directly soldered to the heat sink. The integrated AlSiC heat sink molded along with the copper lead frame in a plastic housing has no "substrate" as in a conventional power module.

There are no assembly process stack up interface issues.

There are no mounting issues as in the conventional power modules.

A high assembly yield can be attained.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power module comprising:
    a heat sink;
    a power switching element attached to said heatsink by an adhesive, said adhesive requiring reflow; and
    a plastic frame comprised of a material which can withstand a reflow temperature of said adhesive; and
    a power terminal molded in said plastic frame, wherein said power terminal is electrically connected with said heatsink, whereby said power terminal is in electrical connection with said power switching element,
    wherein said heat sink is embedded in said plastic frame before said power switching element is attached to said heatsink.

2. A power module according to claim 1, wherein said adhesive is solder.

3. A power module according to claim 1, wherein said adhesive is conductive epoxy.

4. A power module according to claim 1, wherein said power switching element is a power MOSFET.

5. A power module according to claim 1, wherein said heatsink is comprised of AlSiC.

6. A power module according to claim 1, further comprising a solderable layer disposed on said heatsink, wherein said power switching element is attached to said solderable layer by solder.

7. A power module comprising:
    a heatsink, said heatsink being comprised of AlSiC;
    a power switching element attached to said heatsink;
    a plastic; and
    a power terminal molded in said plastic frame, wherein said power terminal is electrically connected with said heatsink, whereby said power terminal is in electrical connection with said power switching element, wherein said heatsink is molded into said plastic frame before said power switching element is attached to said heatsink.

8. A power module according to claim 7, said heatsink further comprising a solderable layer, said power switching device being attached to said solderable layer by solder.

9. A power module according to claim 8, wherein said frame is comprised of a plastic which can withstand a reflow temperature of said solder.

10. A power module according to claim 7, wherein said power switching element is a power MOSFET.

11. A power module according to claim 7, wherein said power terminal is coupled to said heatsink.

12. A power module according to claim 7, further comprising a control IC disposed within said plastic frame.

13. A power module comprising:
    a plastic frame;
    a heatsink comprised of AlSiC molded into said plastic frame;
    a power switching element comprised of a power MOSFET attached to said heatsink;
    a power terminal molded in said plastic frame, said power terminal is electrically connected with said heatsink and in electrical connection with said power switching element, wherein said power terminal is electrically connected with said heatsink by a plurality of wirebonds.

14. A power module according to claim 13, wherein said heatsink includes a wirebondable surface and said wirebonds are bonded to said wirebondable surface.

15. A power module comprising:
    a half bridge circuit including a high side switch and a low side switch;
    at least two heatsinks, said high side switch being attached to a first heatsink and said low side switch being attached to a second heatsink;
    a first power terminal in electrical communication with said first heatsink;
    a second power terminal in electrical communication with said-second heatsink;
    a plastic frame, wherein; said heatsinks are molded in said plastic frame before said high side switch and said low side switch are attached; and
    an output lead.

16. A power module according to claim 15, wherein said heatsinks are comprised of AlSiC.

17. A power module according to claim 15, further comprising a solderable layer disposed on each said heatsink, wherein each said switch is electrically attached to a solderable layer on a heatsink by solder.

18. A power module according to claim 17, wherein said plastic frame can withstand at least a solder temperature of said solder.

19. A power module comprising:
   a half bridge circuit including a high side switch and a low side switch;
   at least two heatsinks, said high side switch being attached to a first heatsink, and said low side switch being attached to a second heatsink;
   a first power terminal in electrical communication with said first heatsink;
   a second power terminal in electrical communication said second heatsink;
   a plastic frame, said at least two heatsinks being molded in said plastic frame; and
   an output lead
   wherein said first power terminal is in electrical communication with said first heatsink by a plurality of wirebonds, said wirebonds being connected to a wirebondable surface on said first heatsink.

20. A power module according to claim 15, wherein said first power terminal is coupled to said one of said heatsinks.

21. A power module according to claim 15, further comprising a control IC disposed within said frame and in communication with said high side switch and said low side switch.

22. A power module according to claim 15, further comprising another half bridge circuit, said another half bridge circuit including another high side switch disposed on said one of said heatsinks, and another low side switch, said another low side switching being disposed on said other one of said heatsinks.

23. A power module according to claim 22, wherein said high side switches and said low side switches are power MOSFETs.

* * * * *